(12) United States Patent
Vodakov et al.

(10) Patent No.: US 6,508,880 B2
(45) Date of Patent: *Jan. 21, 2003

(54) APPARATUS FOR GROWING LOW DEFECT DENSITY SILICON CARBIDE

(75) Inventors: Yury Alexandrovich Vodakov, St. Petersburg (RU); Mark Grigorievich Ramm, Forest Hills, NY (US); Evgeny Nikolaevich Mokhov, St. Petersburg (RU); Alexandr Dmitrievich Roenkov, St. Petersburg (RU); Yury Nikolaevich Makarov, Richmond, VA (US); Sergei Yurievich Karpov, St. Petersburg (RU); Mark Spiridonovich Ramm, St. Petersburg (RU); Heikki I. Helava, Piedmont, CA (US)

(73) Assignee: The Fox Group, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/782,949
(22) Filed: Feb. 14, 2001

(65) Prior Publication Data

US 2002/0038627 A1 Apr. 4, 2002

Related U.S. Application Data

(60) Provisional application No. 60/182,553, filed on Feb. 15, 2000.

(51) Int. Cl.[7] .............................................. C30B 25/12
(52) U.S. Cl. ..................... 117/202; 117/88; 117/107; 117/108; 117/109; 117/200; 117/902
(58) Field of Search ........................ 117/88, 109, 108, 117/107, 200, 202, 902

(56) References Cited

U.S. PATENT DOCUMENTS

| | | | |
|---|---|---|---|
| RE34,861 E | 2/1995 | Davis et al. | 437/100 |
| 5,679,153 A | 10/1997 | Dmitriev et al. | 117/106 |
| 5,968,261 A | * 10/1999 | Barrett et al. | 117/13 |

OTHER PUBLICATIONS

W. Bahng et al., "Rapid Enlargement of SiC Single Crystal Using A Cone–Shaped Platform", Journal of Crystal 209, (2000), pp 767–772.

Wide Bankdgap Semiconducting Materials and Device Challenges, Naval Research Reviews, vol. 51, No. 1 (1999), pp 1–71.

* cited by examiner

Primary Examiner—Robert Kunemund
(74) Attorney, Agent, or Firm—Bingham McCutchen, LLP; David G. Beck

(57) ABSTRACT

A low defect (e.g., dislocation and micropipe) density silicon carbide (SiC) is provided as well as an apparatus and method for growing the same. The SiC crystal, grown using sublimation techniques, is preferably divided into two stages of growth. During the first stage of growth, the crystal grows in a normal direction while simultaneously expanding laterally. Although dislocations and other material defects may propagate within the axially grown material, defect propagation and generation in the laterally grown material are substantially reduced, if not altogether eliminated. After the crystal has expanded to the desired diameter, the second stage of growth begins in which lateral growth is suppressed and normal growth is enhanced. A substantially reduced defect density is maintained within the axially grown material that is based on the laterally grown first stage material.

40 Claims, 8 Drawing Sheets

APPARATUS FOR GROWING LOW DEFECT DENSITY SILICON CARBIDE

CROSS-REFERENCES TO RELATED APPLICATIONS

This application claims priority of U.S. Provisional Patent Application Ser. No. 60/182,553, filed Feb. 15, 2000.

FIELD OF THE INVENTION

The present invention relates generally to silicon carbide and, more particularly, to a method and apparatus for growing low defect density silicon carbide.

BACKGROUND OF THE INVENTION

Silicon carbide (SiC) has a number of characteristics that make it an ideal candidate for a variety of semiconductor applications, primarily those requiring high power handling capabilities. Arguably the most important characteristic of SiC is its indirect bandgap, resulting in relatively high recombination lifetimes and the ability to produce higher voltage junctions than those that can be produced from a direct bandgap material. The large bandgap of this material also provides for negligible current leakage up to 500° C., thereby allowing for high temperature operation without excessive leakage current or thermal runaway. The switching frequency of SiC devices is much higher than that of a device fabricated from silicon or gallium arsenide due to SiC's high breakdown strength and the resultant reduction in minority carrier storage and associated switching losses. Lastly, due to the high junction temperature and the high thermal conductivity of SiC, devices fabricated from SiC have reduced cooling requirements.

Although semiconductor devices based on SiC offer vast improvements over devices fabricated from silicon, in order to realize these improvements materials must be fabricated with much lower defect densities than have been obtainable heretofore. As noted by the authors in the 1999 article entitled *SiC Power Devices*, Naval Research Reviews, Vol. 51, No. 1 (1999), in order to scale up devices fabricated from SiC, the density of dislocations as well as the density of micropipes must be reduced. Conventional SiC material has a dislocation density between $10^5$ and $10^6$ per square centimeter and a micropipe density between $10^2$ and $10^3$ per square centimeter. Some extremely high quality SiC material has been grown with dislocation densities on the order of $10^4$ per square centimeter. Unfortunately, even this dislocation density is at least an order of magnitude too high for many semiconductor applications. Id. at page 21.

U.S. Pat. No. 5,679,153 discloses a technique of growing SiC epitaxial layers using liquid phase epitaxy in which the density of micropipes is substantially reduced or eliminated. In one aspect of the disclosed technique, an epitaxial layer of SiC is formed on a bulk single crystal of SiC, the epitaxial layer being of sufficient thickness to close micropipe defects propagated from the bulk crystal. In order to form an electronically active region for device formation, a second epitaxial layer is formed on the first epitaxial layer by chemical vapor deposition. Based on this technique, SiC layers having micropipe densities of between 0 and 50 micropipes per square centimeter on the surface were claimed.

Although techniques have been disclosed to achieve SiC materials with low micropipe densities, these techniques do not lend themselves to growing bulk materials, i.e., materials that are at least a millimeter thick or more preferably, at least a centimeter thick. Additionally, these techniques do not impact the dislocation densities of the material. Accordingly, what is needed in the art is a technique of growing bulk SiC material with defect densities on the order of $10^3$ per square centimeter, more preferably on the order of $10^2$ per square centimeter, and even more preferably on the order of 10 or less dislocations per square centimeter. The present invention provides such a technique and the resultant material.

SUMMARY OF THE INVENTION

In accordance with the invention, a low defect density silicon carbide (SiC) is provided as well as an apparatus and method for growing the same. The SiC crystal, grown using sublimation techniques, is divided into two stages of growth. During the first stage of growth, the crystal grows in a normal direction while simultaneously expanding laterally. Preferably during this stage the ratio of the lateral growth rate to the axial growth rate is between 0.35 and 1.75. Although dislocations and other material defects may propagate within the axially grown material, defect propagation and generation in the laterally grown material are substantially reduced, if not altogether eliminated. After the crystal has expanded to the desired diameter, the second stage of growth begins in which lateral growth is suppressed and normal growth is enhanced. Preferably during this stage the ratio of the lateral growth rate to the axial growth rate is between 0.01 and 0.3, and more preferably between 0.1 and 0.3. A substantially reduced defect density is maintained within the axially grown material that is based on the laterally grown first stage material. Preferably during this stage the ratio of the lateral growth rate to the axial growth rate is between 0.01 and 0.3, and more preferably between 0.1 and 0.3. A substantially reduced defect density is maintained within the axially grown material that is based on the laterally grown first stage material.

In one aspect of the invention, a SiC material is provided with a low defect density, defects including both dislocations and micropipes. The defect density in the grown SiC is less than $10^4$ per square centimeter, preferably less than $10^3$ per square centimeter, more preferably less than $10^2$ per square centimeter, and still more preferably less than 10 per square centimeter. In at least one embodiment, SiC is grown comprised of an axially grown region and a laterally grown region, the laterally grown region having the desired low defect density. In another embodiment of the invention, the SiC is comprised of a central region having a first defect density and a perimeter region encircling the central region that has a second defect density. The second defect density is substantially less than the first defect density and is less than $10^3$ per square centimeter, preferably less than $10^2$ per square centimeter, and more preferably less than 10 per square centimeter. In another embodiment of the invention, the SiC material is comprised of a SiC seed crystal, a first crystalline growth region initiating at a growth surface of the SiC seed crystal and following an axial growth path, and a second crystalline growth region of the desired defect density initiating at a growth surface of the SiC seed crystal and following a laterally expanding growth path. The laterally expanding growth path is at an angle of at least 25 degrees, and preferably at least 45 degrees, from the normal, i.e., axial, growth path.

In another aspect of the invention, a method of growing a SiC material with a low dislocation density is provided. In at least one embodiment, a SiC seed crystal is introduced into a sublimation system wherein both axial and lateral crystal growth is promoted, at least during one stage of growth. Propagation of dislocation defects, including micropipes, from the seed crystal into the laterally grown crystal is substantially reduced as is generation of dislocation defects within this region. In at least another embodiment of the invention, a SiC seed crystal is introduced into a sublimation system and heated to a temperature sufficient to cause sublimation. Temperature gradients within the sublimation system as well as temperature differentials between the crystallization growth front and adjacent surfaces promote a first stage of free space crystal expansion wherein the crystallization front expands both axially and laterally followed by a second stage of free space crystal expansion wherein the crystallization front expands axially while lateral expansion is suppressed.

In another aspect of the invention, an apparatus for use in growing a SiC material with a low dislocation density is provided. In at least one embodiment of the invention, the apparatus includes a ring element that promotes lateral crystal expansion, preferably through the use of a conical surface. The ring element may also be used to shield the edge of the SiC seed from the growth process. The ring element may also include a second surface, preferably conical, that promotes lateral crystal contraction. Preferably the ring element inner surfaces are comprised of either $Ta_xC_y$ or $Nb_xC_y$. In at least one embodiment of the invention, the apparatus also includes a graphite heat sink coupled to a non-growth surface of the SiC seed crystal, a growth chamber with inner surfaces preferably comprised of either $Ta_xC_y$ or $Nb_xC_y$, and means for applying temperature gradients to the crucible.

A further understanding of the nature and advantages of the present invention may be realized by reference to the remaining portions of the specification and the drawings.

DESCRIPTION OF THE SPECIFIC EMBODIMENTS

The dislocations in (0001) silicon carbide (SiC) seed crystals are primarily threading and screw dislocations in the <0001> crystal direction. Micropipe defects are basically screw dislocations with a Burger's vector that is so large that the core of the screw is empty. The inventors have found that by growing a crystal under the appropriate conditions in the radial direction (i.e., lateral direction) rather than the axial direction, the multiplication of <0001> dislocations is suppressed. Accordingly, under the appropriate conditions, a defect free SiC crystal can be grown using sublimation techniques.

Figure 1:
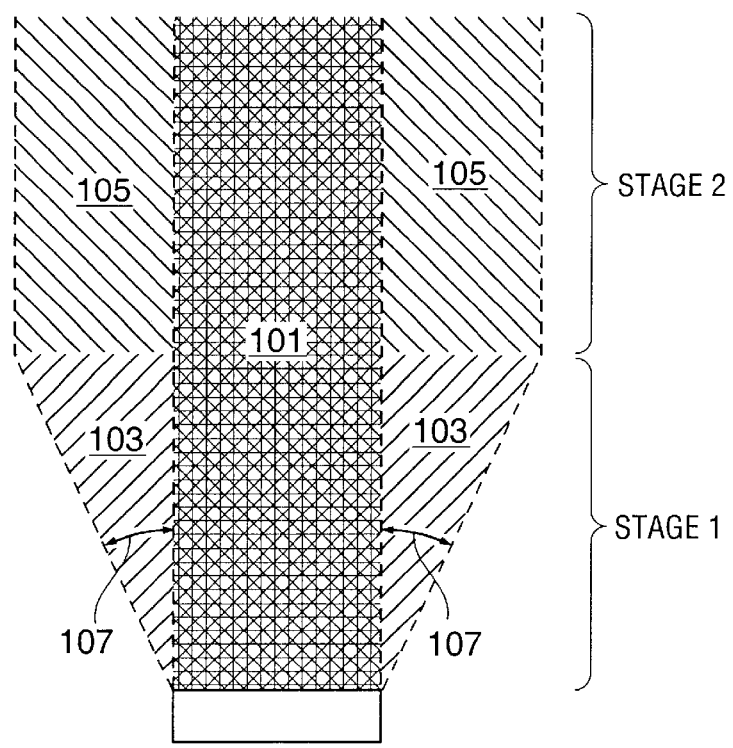
FIG. 1 schematically illustrates the regions of defect free crystal growth in accordance with the invention.

In the preferred embodiment of the invention, as illustrated in FIG. 1, crystal growth is divided into two stages. During the first stage of growth, the crystal grows in a normal direction (i.e., vertically) while simultaneously expanding laterally. Preferably during this stage the ratio of the lateral growth rate to the axial growth rate is between 0.35 and 1.75. After the crystal has expanded to the desired diameter, lateral growth is suppressed while normal growth is enhanced (i.e., the second stage of growth). Preferably during this stage the ratio of the lateral growth rate to the axial growth rate is between 0.01 and 0.3, and more preferably between 0.1 and 0.3. In the preferred embodiment this ratio is not too low, thereby achieving a slightly convex growth surface and avoiding singularization of this surface. Lateral crystal growth is limited by the size of the crucible, which, in turn, is primarily limited by the ability to achieve the required temperature gradients.

Figure 2:
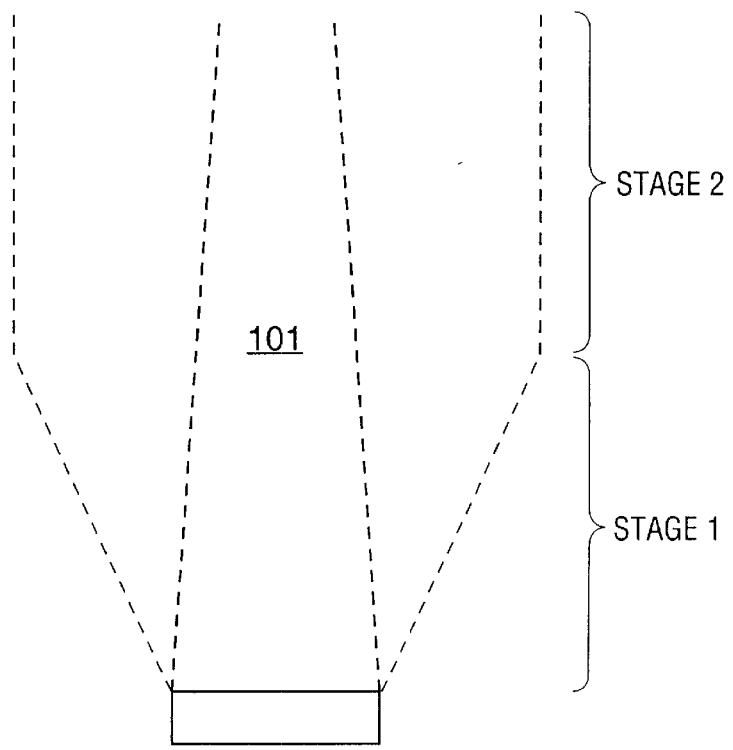
FIG. 2 schematically illustrates a reduction in the core region during crystal growth.

According to the invention, although dislocations and other material defects propagate within core region 101, defect propagation and generation is substantially reduced, if not altogether eliminated, in the laterally grown area 103. Additionally, a substantially reduced defect density is maintained within the axially grown material that is based on the laterally grown material, i.e., regions 105. Preferably the growth conditions are chosen to reduce the size of core region 101 during growth as illustrated in FIG. 2.

In order to achieve defect free lateral crystal growth, the inventors have found that preferably a number of conditions are met. These conditions, discussed in further detail below, include:

(i) High quality seed crystal—Preferably the growth surface of the seed crystal is defect free, thereby minimizing the propagation of defects within the core region of the grown crystal.

(ii) Shielding the back surface of the seed crystal to prevent initiation of dislocations and other microscopic defects (e.g., planar defects) which can propagate through the crystal and impact the quality of the grown crystal.

(iii) Selection of the proper growth angle—Generally angle 107 in FIG. 1 must be greater than 25 degrees, and preferably greater than 45 degrees. This angle is primarily determined by two factors; first, the vertical temperature gradient between the source and the seed crystal and second, the lateral temperature gradient between the center of the crucible and the crucible walls.

(iv) Selection of an appropriate seed crystal diameter—Generally the diameter of the seed crystal should be less than 30 percent of the diameter of the crystal to be grown.

(v) Prevention of polycrystalline growth—Requires the elimination of contact between the laterally growing material and the crucible side-walls thus insuring free-space expansion of the crystal. This is achieved by maintaining a temperature differential between the laterally growing crystal and the crucible side-walls.

Figure 3:
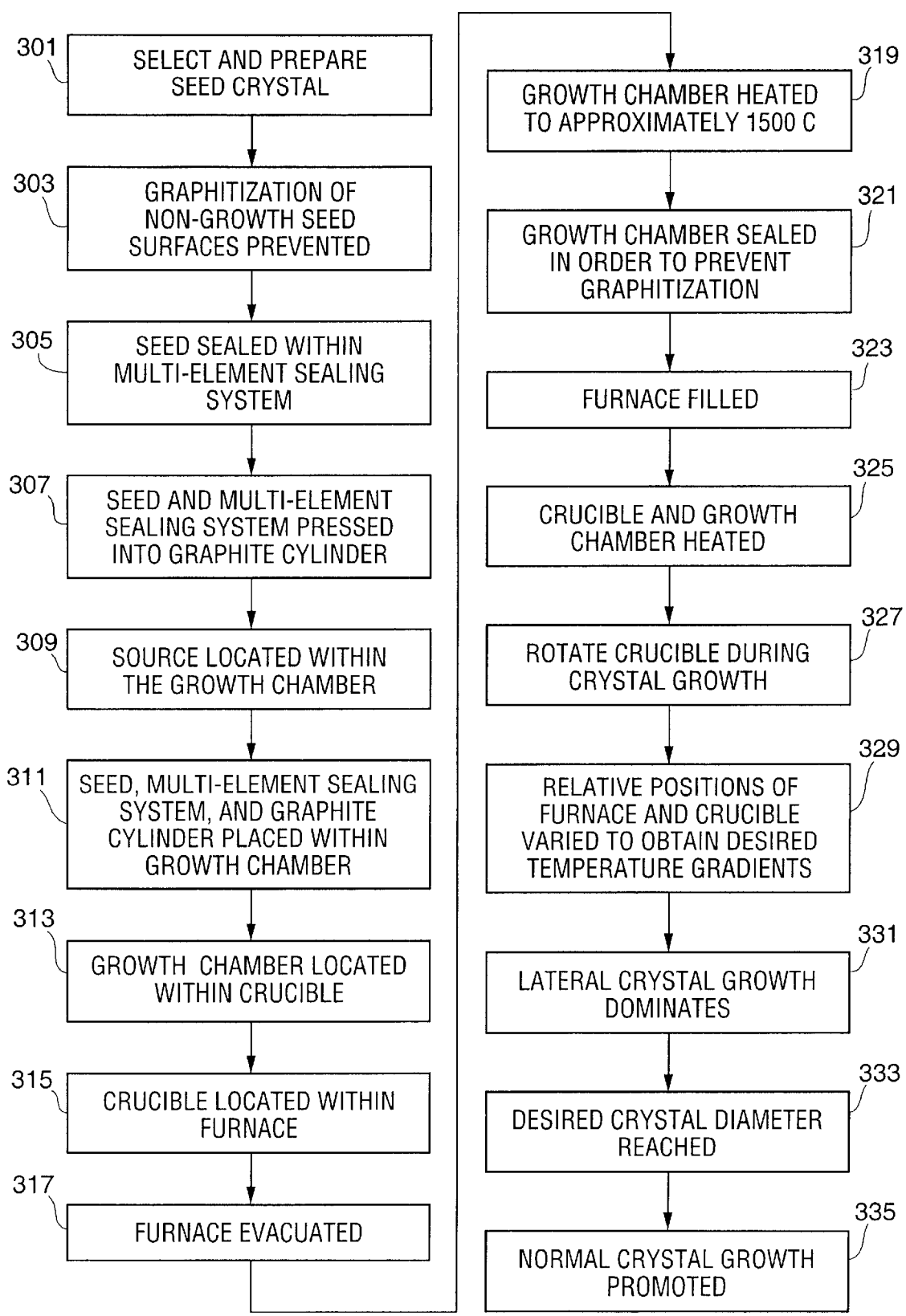
FIG. 3 illustrates the basic methodology applied to achieve low defect density SiC.
Figure 4:
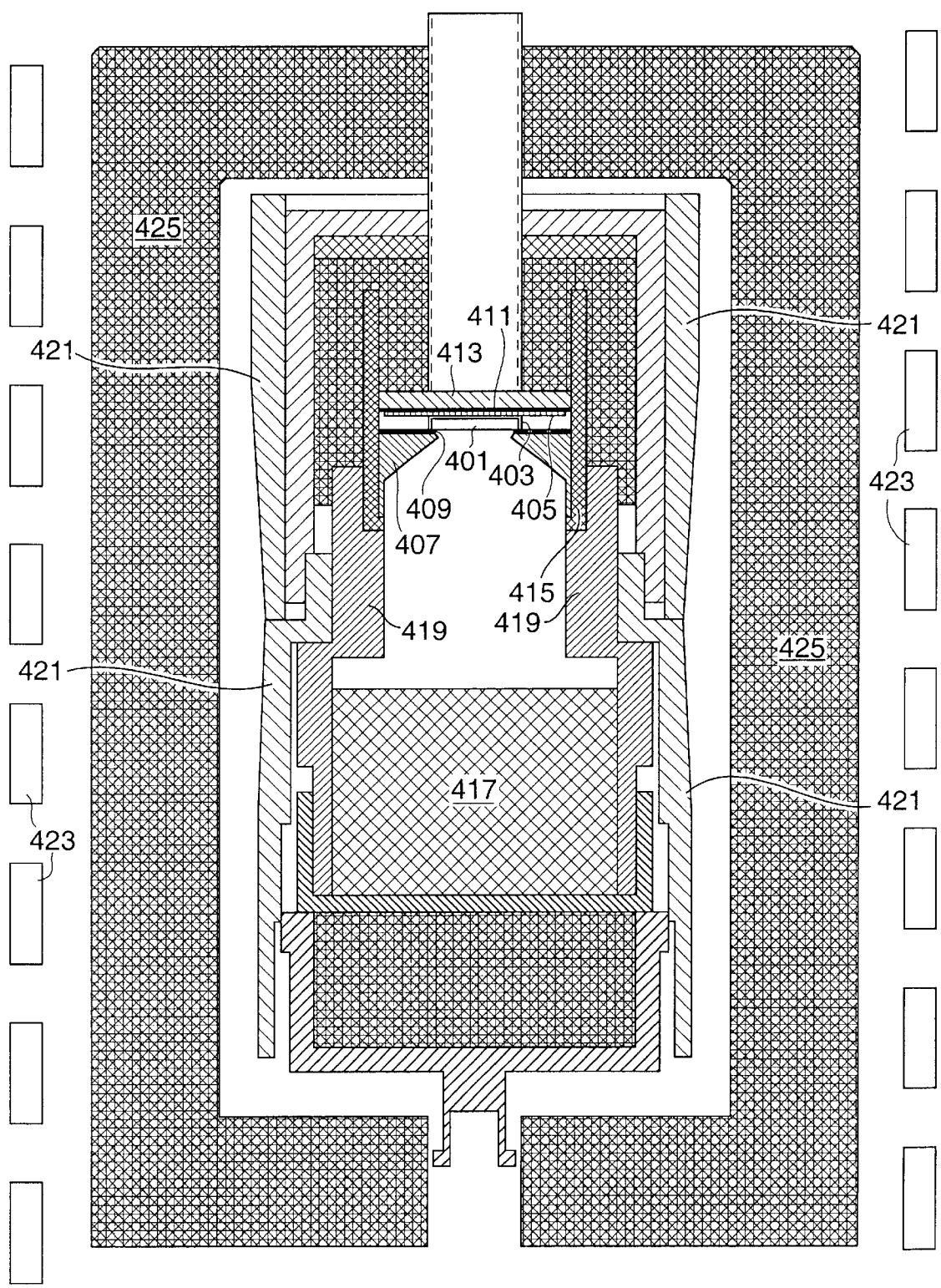
FIG. 4 illustrates the preferred design of the sublimation system.

FIG. 3 illustrates the basic methodology applied to achieve defect free SiC while corresponding FIG. 4 illustrates the preferred design for the furnace and crucible. Initially a SiC seed crystal 401 is selected and prepared. (Step 301) Seed crystal 401 can be grown using any of a number of well known techniques (e.g., Lely method). In the preferred embodiment a seed crystal with minimal defects is used, typically on the order of $10^5$ per square centimeter or less. Also preferably the seed crystal has minimal, if any, micropipe defects. The ratio of the diameter of seed crystal 401 to the diameter of the crystal to be grown is preferably less than 0.3.

In the preferred embodiment of the invention, surface mechanical defects are removed from the surface of the seed crystal using conventional surface preparation techniques, e.g., grinding, polishing, and chemical etching. In this embodiment, approximately 50 microns is removed although the removal of additional material in excess of a 50 micron layer may be required in order to achieve the desired surface. Preferably the surface finish has an RMS roughness of 50 Angstroms or less.

During crystal growth, it is important to prevent graphitization. (Step 303) Accordingly, the back surface of seed crystal 401 is preferably shielded during evaporation. The preferred method of shielding the non-growth surfaces of seed crystal 401 is to place the growth surface of the crystal onto the flat, polished surface of a tantalum disk. Then the wafer is annealed in vacuum for a few minutes at 1700 to 1750° C., yielding a dense graphite layer 403 on those seed crystal surfaces not in contact with the tantalum disk. Once formed, back surface graphite layer 403 is coupled to a holder 405. Preferably holder 405 is comprised of graphite or pyrographite and a graphite based glue is used to couple seed crystal 401 to holder 405, the glue eliminating voids in the joint between the two surfaces. In addition to helping to prevent graphitization, the above-described crystal seating process also prevents localized temperature non-uniformities in the seating area that arise from having voids between the back surface of the seed crystal and the crucible lid (e.g., the seed holder).

In an alternate embodiment, the dense graphite layer 403 is grown on all seed crystal surfaces and subsequently removed from the growth surface, for example using an epi-polishing technique.

In order to shield the non-growth seed surfaces of the seed crystal from evaporation, in the preferred embodiment of the invention seed crystal 401 is sealed within a multi-element system that includes a ring element 407. (Step 305) Ring element 407 is not only integral to the sealing system, it also helps to shape the desired lateral growth of the crystal. The outer surface of element 407 is cylindrical while the inner surfaces are generally conical and coated with $Ta_xC_y$ or $Nb_xC_y$. Preferably the inner surfaces of element 407 are comprised of a pair of conical surfaces as shown in FIG. 4.

Seed crystal 401 is pressed and sealed to ring element 407 using a gas impermeable graphite foil 409. As shown, the inner diameter of the portion of ring element 407 adjacent to seed crystal 401 as well as the interposed gas impermeable foil 409 is smaller than the outer diameter of crystal 401. Accordingly, the edge of crystal 401 is unexposed, thus controlling growth of crystal defects that typically would originate at the crystal edge, the crystal edge defined as the juncture of the crystal face surface and the crystal side surface. In addition to preventing exposure of the crystal edge, ring element 407 provides a means of achieving the desired lateral temperature gradient and thus, as previously noted, provides a means of controlling the lateral growth of the crystal.

In the preferred embodiment of the invention, the inner surface of ring element 407 is comprised of a pair of conical surfaces, the pair of conical surfaces providing a slight necking down of the crystal growth surface. As such, prior to undergoing lateral expansion, the crystal growth surface undergoes an initial period of contraction. In an alternate embodiment, ring element 407 is comprised of a single conical inner surface that defines the laterally expanding crystal surface. In an alternate embodiment, ring element 407 is comprised of a single conical inner surface that defines the laterally expanding crystal surface and a non-conical inner surface immediately adjacent to the seed crystal that insures that the crystal growth interface initially undergoes a period of contraction prior to undergoing lateral expansion. As in the preferred embodiment, in the alternate embodiments the inner diameter of the portion of element 407 in contact with foil 409 (and adjacent to crystal 401) is smaller than the outer diameter of seed crystal 401, thus controlling growth of edge defects.

A second gas impermeable graphite foil 411 is used to seal the back surface of seed crystal 401 and holder 405 to a graphite heat sink 413. Foil 411 helps to achieve a good thermal contact between crystal 401/holder 405 and heat sink 413, the thermal contact preferably being continuous across the entire heat sink interface. As shown, the outer diameter of graphite heat sink 413 is substantially equal to the outer diameter of ring element 407. The stack, comprised of heat sink 413, holder 405, seed crystal 401, ring element 407, and seals 409 and 411, is press fit within a thin-wall graphite cylinder 415 (step 307), thereby preventing reactive gases such as Si, $Si_2C$, and/or $SiC_2$ from reaching the non-growth surfaces of seed crystal 401.

A source 417 is placed within a growth chamber 419. (Step 309). Seed crystal 401, the multi-element sealing system and graphite cylinder 415 are then located within the growth chamber. (Step 311) Growth chamber 419 is fabricated from $Ta_xC_y$, $Nb_xC_y$, or graphite. If graphite is used for growth chamber 419, the inner surfaces of the chamber are coated with either $Ta_xC_y$ or $Nb_xC_y$. Preferably the distance between the seed crystal growth surface and the top of the source material 417 is less than 30 percent of the diameter of source 417, thus allowing quasi-equilibrium vapor phase conditions to be maintained.

Source 417 is fabricated in such a manner as to suppress the formation of source particles in the gas phase during crystal growth. In the preferred embodiment of the invention, this goal is achieved by annealing electronic grade SiC powder or a mixture of Si and C powders at a temperature of between about 2100 and 2500° C. for approximately 1 hour. As a result of the annealing process, a dense deposit is formed that eliminates particle formation during crystal growth. In order to obtain doped SiC crystals using the invention, the desired dopants and/or impurities (e.g., nitrogen, boron, aluminum, indium, vanadium, molybdenum, scandium, chromium, iron, magnesium, tin, and zirconium) are included in source 417.

Growth chamber 419 is placed within a two-piece graphite crucible 421 (step 313), the shape (e.g., the tapered portions) of which is designed to provide the temperature gradients described in further detail below. In order to prevent graphitization, a requirement of the present invention, the stoichiometry of the vapor within the growth chamber, i.e., the ratio of silicon to carbon, must remain relatively constant during crystal growth. One method of realizing this objective is to minimize material losses. Accordingly, in the preferred embodiment of the invention, the rate of material loss during the growth process is maintained at a level of less than 0.5 percent of the initial source weight per hour. In particular this rate loss is achieved by first locating graphite crucible 421 within a high temperature furnace 423, preferably an RF induction furnace as shown. (Step 315) Graphite foam 425 is used to suppress heat losses from the furnace. The furnace, along with the growth chamber, is next evacuated down to a pressure of $10^{-5}$ torr or less (step 317) and then heated to a temperature of approximately 1500° C. (step 319). Chamber 419 is then sealed, preferably using different types of graphite with different coefficients of thermal expansion, in order to prevent graphitization. (Step 321)

After chamber sealing, the furnace is filled with pure argon or argon with traces of nitrogen. (Step 323) To obtain the desired resistivity within the grown crystal, the partial pressure of the gas filled furnace is maintained within a range of $10^{-1}$ to $10^{-4}$ torr. Crucible 421 and chamber 419 are then heated to a temperature of between 1900 and 2400° C. at a rate of between 6 and 20° C. per minute. (Step 325)

During crystal growth, crucible 421 is axially rotated at a rate of approximately 1 to 5 revolutions per minute. (Step 327) As the crystal grows, the required temperature gradients are achieved, at least in part, by altering the relative positions of crucible 421 and furnace 423. (Step 329) Typically the rate of movement is approximately equivalent to the rate of crystal growth, i.e., between 0.1 and 1.5 millimeters per hour.

Preferred Crystal Growth Methodology

In addition to the method and apparatus described above, the inventors have found that certain growth methodologies are preferred. As previously noted, free-space expansion of the crystal during growth is critical to achieving defect free SiC. Accordingly, it is important to prevent the formation of polycrystalline deposits on all surfaces that surround seed 401, such surfaces including ring element 407, seed holder 405, graphite cylinder 415, and growth chamber 419. Insuring that the temperature of the surface in question is higher than that of the seed is the preferred technique for preventing polycrystalline deposits. At the same time, however, it is important that the temperature differential between the seed and the adjacent surfaces not be too great, otherwise lateral crystal growth may be deterred. Accordingly, the inventors have found that the temperature differential between the crystallization front and the adjacent surface before the crystallization front should be in the range of 1 to 5° C.

The inventors have found that during the period of time in which the crystal is undergoing lateral expansion, a temperature drop of between 5 and 25° C., and preferably between 5 and 10° C., should be maintained between seed 401 and source 417. This temperature differential aids in the suppression of normal (i.e., non-lateral) crystal growth. Preferably there is a lateral dependence to the temperature differential such that the smallest temperature differential occurs at the center of the seed, increasing with lateral distance. As a result, a convex crystallization growth front is formed which aids in the elimination of micropipe propagation.

As previously described, preferably the angle between the normal crystal growth and the lateral crystal growth (e.g., angle 107 of FIG. 1) is greater than 25 degrees. If the angle is less than 25 degrees, the defects of seed crystal 401 and any defects that may be generated during the initial crystal growth will continue to propagate throughout the newly grown crystal. If the angle is greater than 45 degrees, as in the preferred embodiment of the invention, typically all of the defects will move towards the lateral surface and, once the lateral surface is reached, not participate further in the growth process. In those cases in which not all of the defects are eliminated from participation in the growth process, the defect density in the laterally grown material is typically on the order of $10^2$ per square centimeter or less, and more typically on the order of 10 per square centimeter or less. In the intermediate situation in which the angle is between 25 and 45 degrees, the expansion of defects into the laterally growing crystal body is typically observed. If seed crystal 401 is of a high quality, however, angles within this range may yield crystals of sufficiently low defect density.

Initially, lateral crystal growth dominates (step 331), the laterally grown crystal being free of micropipes and having a defect (e.g., dislocations, micropipes) density less than $10^4$ per square centimeter, preferably less than $10^3$ per square centimeter, more preferably less than $10^2$ per square centimeter, still more preferably less than 10 per square centimeter, and still more preferably with zero defects per square centimeter. As observed, this material is free of any graphite inclusions. Crystal growth, dominated by lateral crystal growth, continues until the desired crystal diameter is reached, this crystal diameter being defined by the growth chamber in general, and for the embodiment illustrated in FIG. 5, by ring element 407. Once the crystal reaches the desired diameter (step 333), the vertical temperature gradient is changed to promote normal, i.e., vertical, crystal growth (step 335). In order to achieve the desired change in the temperature gradient, the relative positions of furnace 423 and crucible 421 are changed. In the preferred embodiment of the invention, furnace 423 is an inductive furnace and the coils of the furnace are moved relative to crucible 421. Alternately, or in addition to changing the relative positions of the furnace and the crucible, the temperature within portions of the furnace may be changed. Preferably the axial temperature gradient, i.e., the gradient between the source and the growth surface, is in the range of 10 to 50° C. per centimeter, yielding the desired normal growth rate of between 0.4 and 1.5 millimeters per hour.

During the last stage of crystal growth it is important to prevent considerable lateral crystal expansion. It is also important, as previously described, to prevent SiC deposits from forming on the crucible side walls (e.g., the side walls of ring element 407, graphite cylinder 415, and growth chamber 419). Accordingly, a higher side wall temperature is maintained relative to the temperature of the seed crystal, preferably the temperature difference being at least 10° C., more preferably between 10 and 30° C., and still more preferably between 10 and 15° C. The higher side wall temperature radiatively heats the sides of the growing crystal, thereby achieving hotter crystal side walls than the normal growth surface of the crystal. As a result, all of the vapor species are consumed at the normal growth surface of the crystal and growth on the crucible side walls is suppressed. Additionally, this temperature difference insures that the growing crystal does not come into contact with the crucible side walls, such contact being a major source of defects.

The inventors have also found that the temperature gradient in the growing crystal must be maintained at a relatively low number, preferably on the order of 5° C. per centimeter or less. If the temperature gradient becomes too large, strain is created within the growing crystal, resulting in the formation of dislocations or other defects.

Detailed Growth Region

Figure 5:
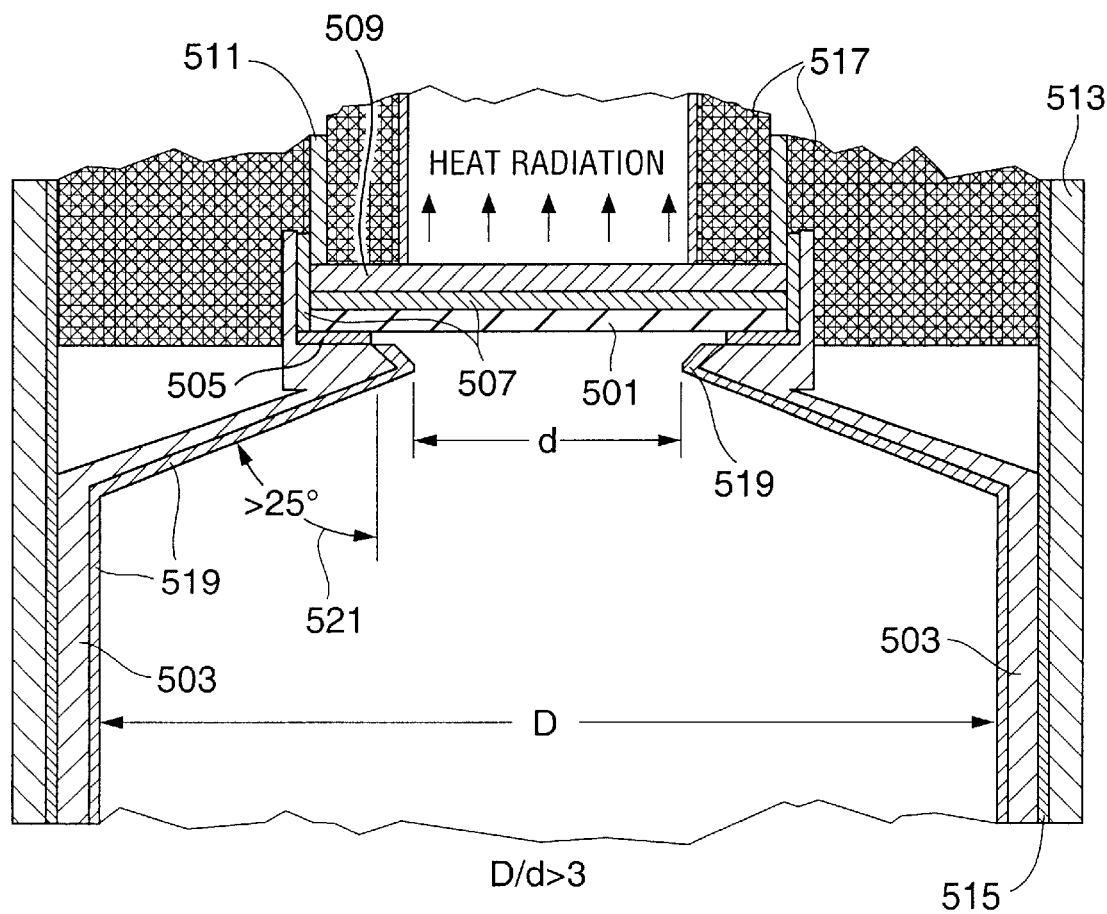
FIG. 5 illustrates a detailed cross-section of the critical growth region of the preferred design of the invention.

FIG. 5 is a cross-sectional view of the critical growth region in the preferred embodiment of the invention. In this embodiment the SiC seed crystal 501 is held within a portion of ring element 503. A graphite foil ring 505 is interposed between ring element 503 and the growth surface of crystal 501, foil ring 505 sealing the seed crystal to the ring element. The side and back surfaces of crystal 501 are covered with a graphite foil 507. A graphite disk 509 is coupled to seed crystal 501 via graphite foil 507. The primary purpose of disk 509 and interposed graphite foil 507 is to aid in the removal of heat from crystal 501. Additionally, disk 509 provides a support surface for crystal 501 as well as a means for conveniently applying pressure to the crystal with graphite ring 511, thereby achieving a seal between the crystal and element 503. Graphite foils 505 and 507 are typically between 0.25 and 0.80 millimeters thick.

Ring element 503 is preferably press fit within a graphite cylinder 513. Graphite foil 515, typically between 0.25 and 0.80 millimeters thick, is preferably interposed between the outer wall of ring element 503 and the inner wall of cylinder 513, thus helping to achieve a good pressure seal. Graphite foam 517 is used to suppress heat losses from the furnace.

In this embodiment of the invention, ring element 503 is fabricated from graphite with inner surfaces 519 coated with $Ta_xC_y$ or $Nb_xC_y$. Diameter D, the largest inner diameter of element 503, is 30 millimeters although there are no major limitations to increasing this diameter, thereby yielding a larger grown crystal. Diameter d, the smallest inner diameter of element 503 is selected such that the ratio D/d is greater than 3. Angle 521 is selected, as previously disclosed, to be greater than 25 degrees and preferably less than 90 degrees.

Thermal Analysis

FIGS. 6–10 provide calculated temperature distributions within the growth cell and in the growing crystal for a specific embodiment of the invention. In FIGS. 6–9 the seed crystal is indicated as substrate 601, the crystal growth interface is indicated as surface 603, and the ring element is indicated as element 605. For purposes of this analysis, ring element 605 is comprised of a single conical surface rather than a pair of conical surfaces as shown in the ring elements of FIGS. 4 and 5.

Figure 6:
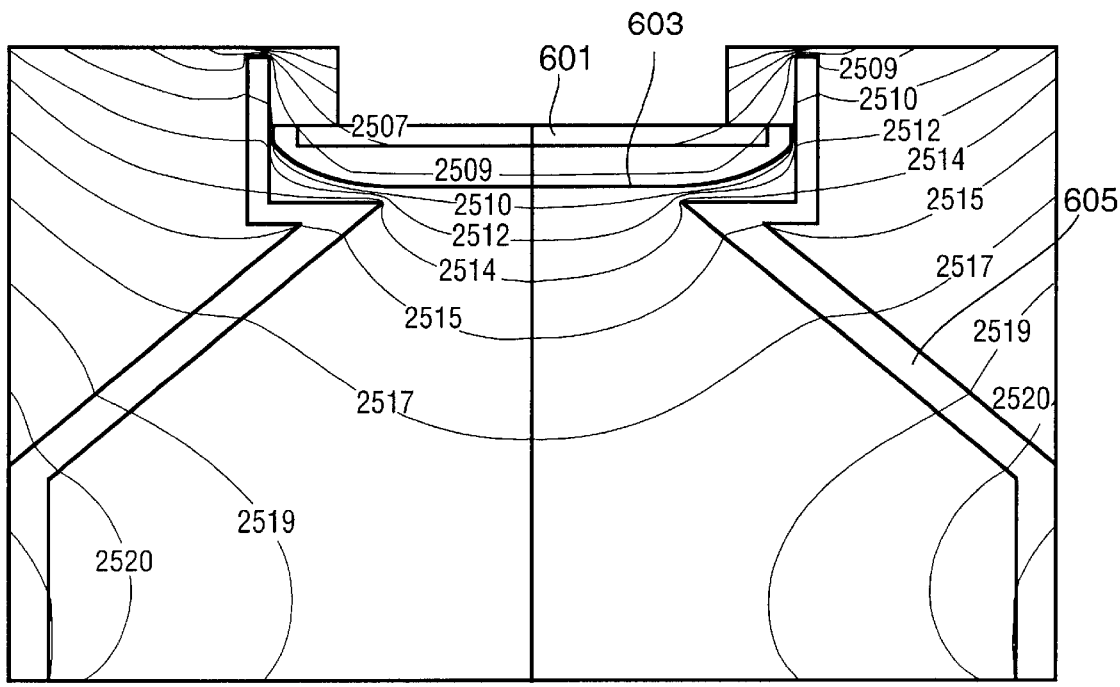
FIG. 6 illustrates the calculated temperature distribution within the growth cell and in the growing crystal for a ring element cone angle of 45 degrees and a growth period of approximately 4 hours.
Figure 7:
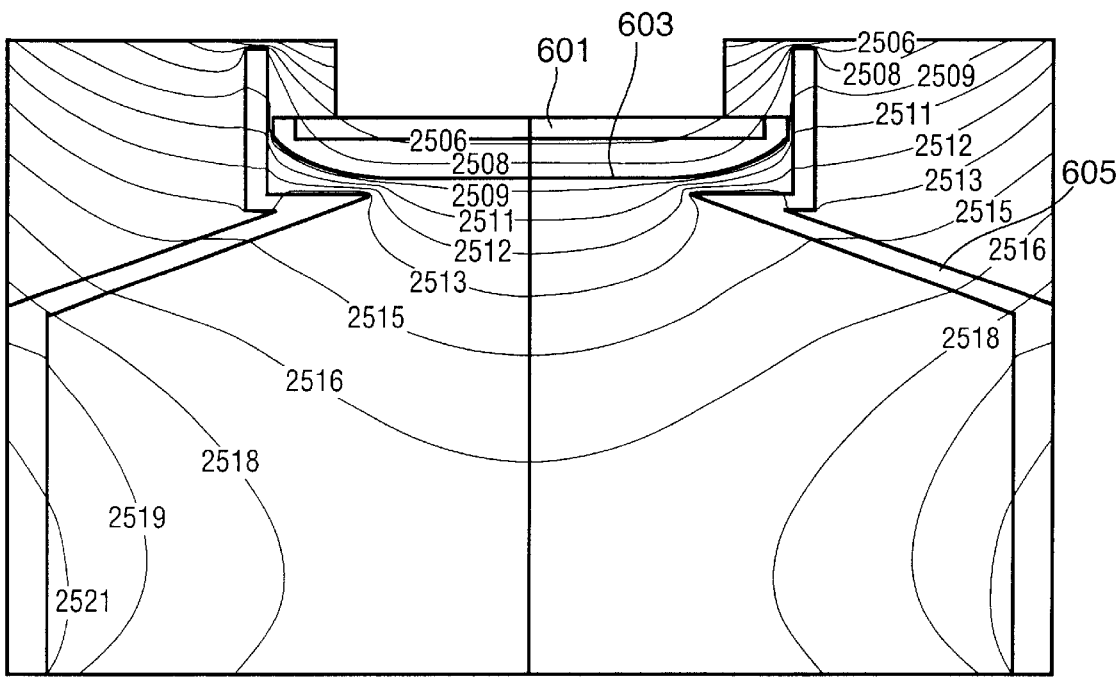
FIG. 7 illustrates the calculated temperature distribution within the growth cell and in the growing crystal for a ring element cone angle of 70 degrees and a growth period of approximately 4 hours.
Figure 8:
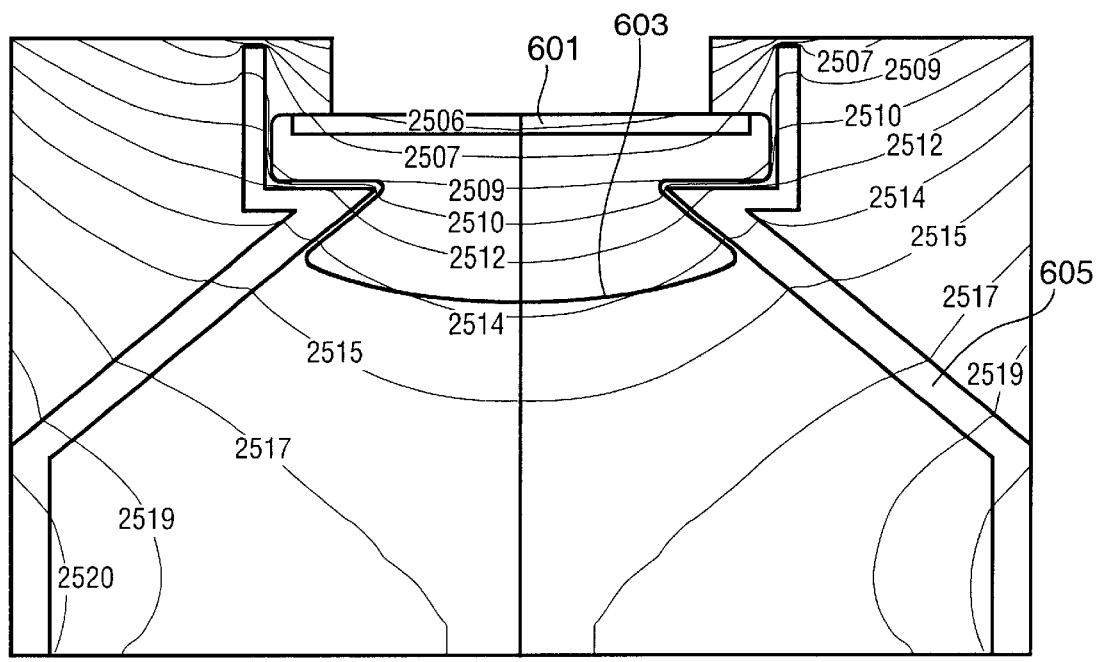
FIG. 8 illustrates the calculated temperature distribution within the growth cell and in the growing crystal for a ring element cone angle of 45 degrees and a growth period of approximately 22 hours.
Figure 9:
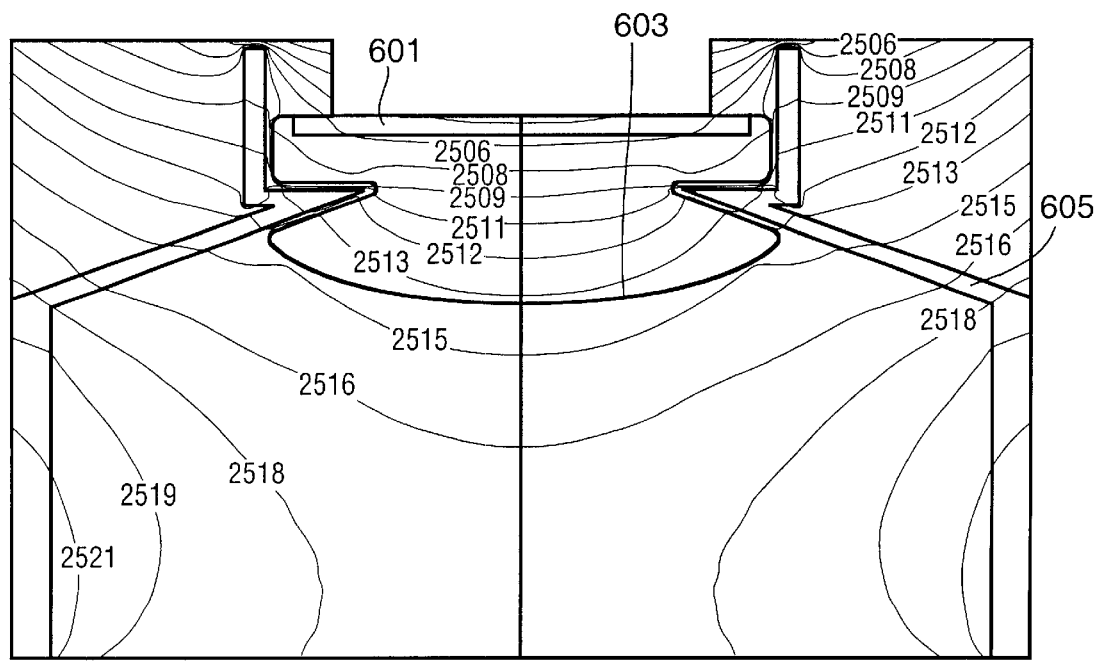
FIG. 9 illustrates the calculated temperature distribution within the growth cell and in the growing crystal for a ring element cone angle of 70 degrees and a growth period of approximately 22 hours.

FIGS. 6 and 7 illustrate the temperature distribution after approximately 4 hours of growth while FIGS. 8 and 9 illustrate the temperature distribution after approximately 22 hours of growth. The cone angle for the ring element in FIGS. 6 and 8 is 45 degrees while the cone angle for the ring element in FIGS. 7 and 9 is 70 degrees.

Figure 10:
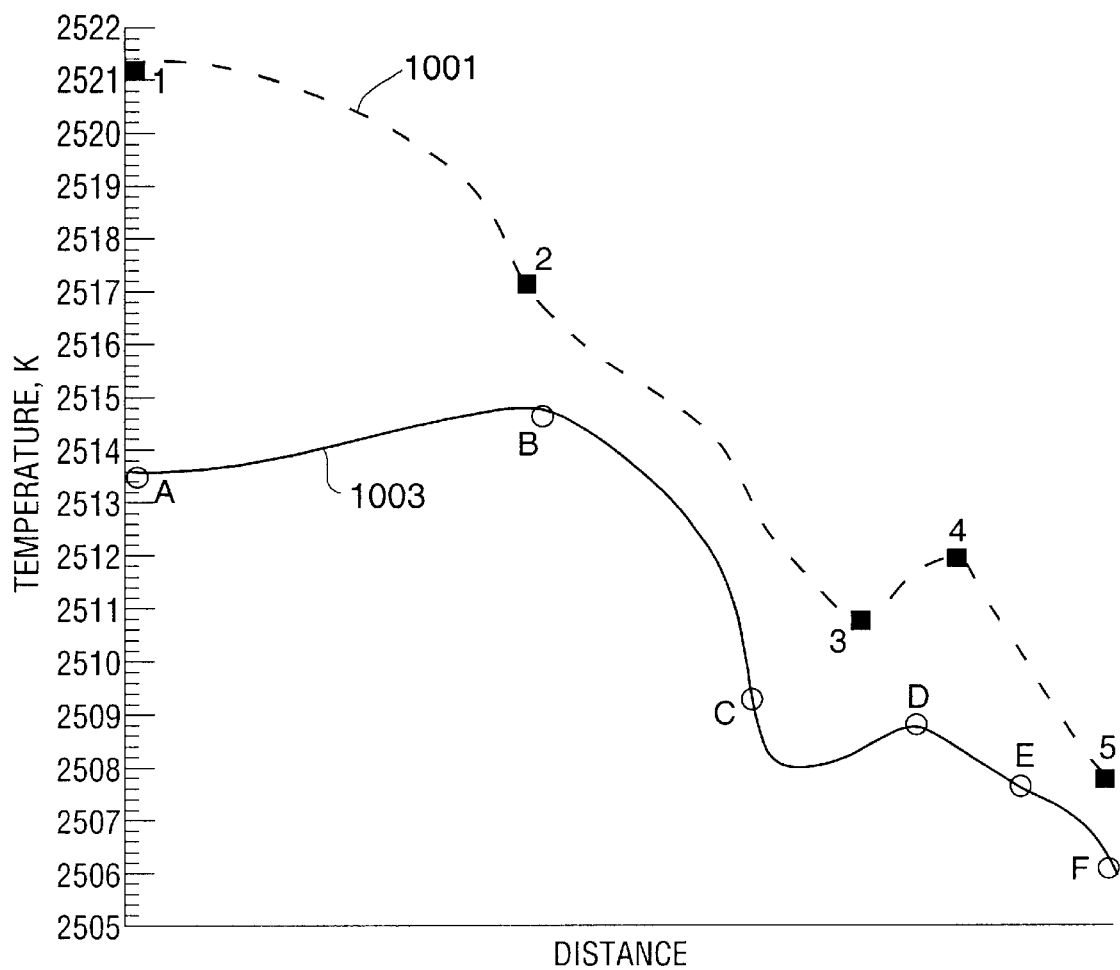
FIG. 10 illustrates a one dimensional temperature distribution over the ring element cell wall and the crystal interface.
Figure 11:
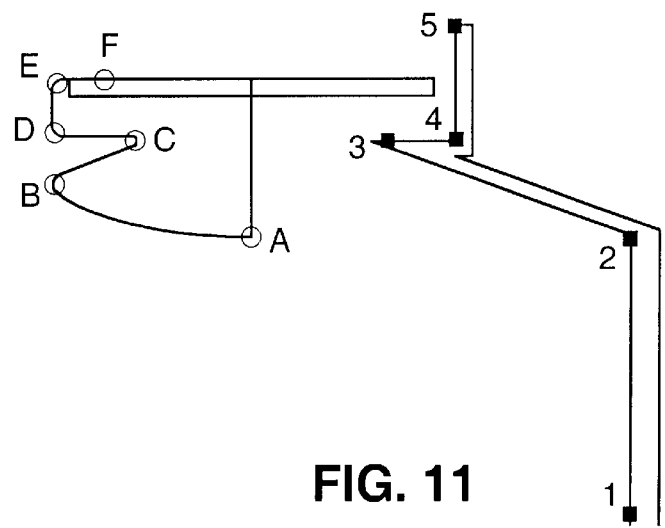
FIG. 11 illustrates the ring element wall locations and the crystal interface locations that correspond to the data points shown in FIG. 10.

FIG. 10 illustrates a one dimensional temperature distribution over the ring element cell wall, i.e., line 1001, and the crystal interface, i.e., line 1003. The ring element wall locations and the crystal interface locations that correspond to the data points shown on lines 1001 and 1003, respectively, are shown in FIG. 11.

Thermal Elastic Stress Distribution

Figure 12:
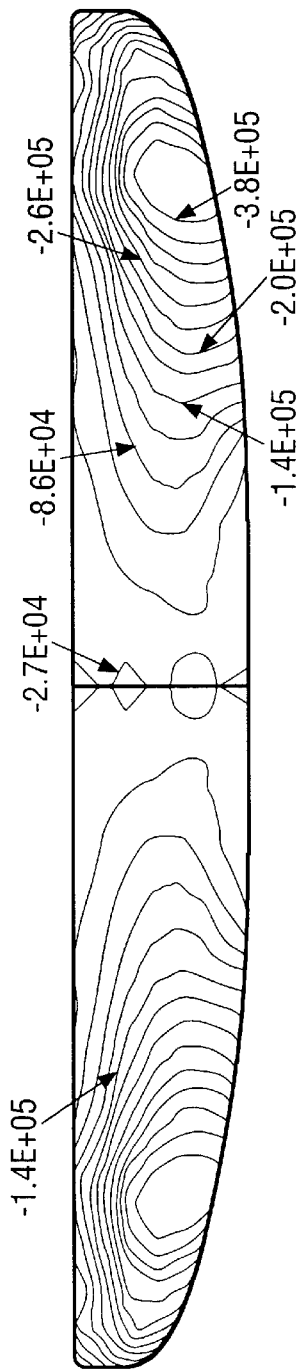
FIG. 12 illustrates the distribution of the principal component of the thermal elastic stress tensor as computed for the temperature distributions shown in FIG. 6.
Figure 13:
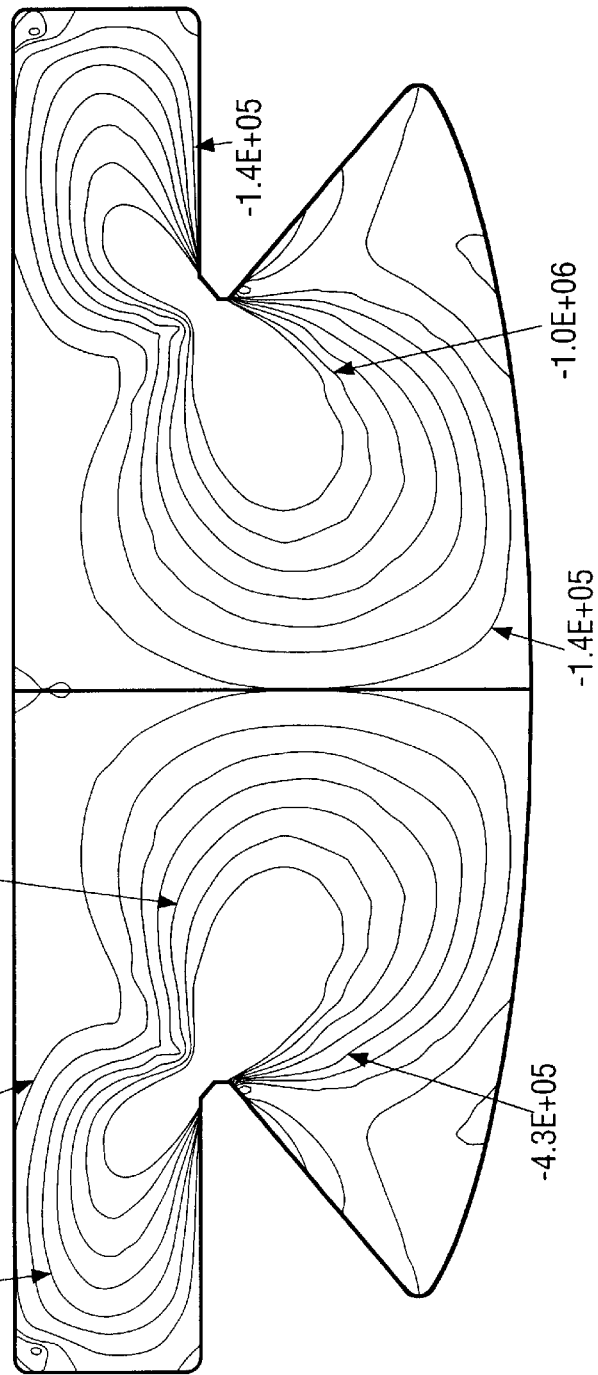
FIG. 13 illustrates the distribution of the principal component of the thermal elastic stress tensor as computed for the temperature distributions shown in FIG. 8.

As disclosed above, the temperature gradient within the growing crystal must be maintained at a relatively low number, preferably 5° C. per centimeter or less. FIGS. 12 and 13 illustrate the distribution of the principal component of the thermal elastic stress tensor $\sigma_{rz}$ given in Pascals, as computed for the temperature distributions shown in FIGS. 6 and 8. The illustrated thermal elastic stress component is responsible for gliding of dislocations.

The computed results indicate that the $\sigma_{rz}$ value does not exceed the SiC plasticity threshold in the major portion of the crystal. Accordingly, the probability of generating dislocations within the growing crystal is negligible.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. An apparatus for suppressing defects during growth of silicon carbide, the apparatus comprising:
    a ring element, comprising:
        a first annular portion coupleable to a growth surface of a single crystal silicon carbide seed crystal;
        a first conical inner surface, said first conical inner surface defining a laterally expanding portion of a crystalline growth front, wherein an angle between said first conical inner surface and a ring element axis is greater than 25 degrees;
        a second conical inner surface interposed between said first annular portion and said first conical inner surface, said second conical inner surface defining a laterally contracting portion of said crystalline growth front;
    a graphite heat sink coupleable to a non-growth surface of said single crystal silicon carbide seed crystal;
    a growth chamber coupleable to said ring element and a silicon carbide source;
    a graphite crucible substantially enclosing said growth chamber;
    a first heating means for applying at least a first temperature gradient and a second temperature gradient to said growth chamber, wherein said first temperature gradient promotes axial crystal growth and promotes lateral crystal expansion, and wherein said second temperature gradient promotes axial crystal growth and suppresses lateral crystal growth; and
    a second heating means for maintaining a higher adjacent surface temperature than a crystalline growth front temperature.

2. The apparatus of claim 1, further comprising a graphite foil interposed between said first annular portion of said ring element and said growth surface of said single crystal silicon carbide seed crystal, said graphite foil sealing said first annular portion of said ring element to said growth surface of said single crystal silicon carbide seed crystal.

3. The apparatus of claim 1, wherein an inner diameter of said first annular portion of said ring element is smaller than an outer diameter of said growth surface of said single crystal silicon carbide seed crystal.

4. The apparatus of claim 1, wherein said first conical inner surface is coated with a material selected from the group of materials consisting of $Ta_xC_y$ and $Nb_xC_y$.

5. The apparatus of claim 1, said ring element further comprising a second conical inner surface interposed between said first annular portion and said first conical inner surface, said second conical inner surface defining a laterally contracting portion of said crystalline growth front.

6. The apparatus of claim 5, wherein said second conical inner surface is coated with a material selected from the group of materials consisting of $Ta_xC_y$ and $Nb_xC_y$.

7. The apparatus of claim 1, wherein said angle between said first conical inner surface and said ring element axis is greater than 45 degrees.

8. The apparatus of claim 1, further comprising a graphite foil interposed between said graphite heat sink and said non-growth surface of said single crystal silicon carbide seed crystal, said graphite foil forming a continuous thermal contact between said graphite heat sink and said non-growth surface of said single crystal silicon carbide seed crystal.

9. The apparatus of claim 1, further comprising a graphite cylinder, wherein an outer portion of said ring element and an outer portion of said graphite heat sink are sealed to an inner surface of said graphite cylinder.

10. The apparatus of claim 1, wherein an inner surface of said growth chamber is comprised of a material selected from the group of materials consisting of $Ta_xC_y$ and $Nb_xC_y$.

11. The apparatus of claim 1, wherein said growth chamber separates said silicon carbide source and said growth surface of said single crystal silicon carbide seed crystal by a distance less than 30 percent of a silicon carbide source diameter.

12. The apparatus of claim 1, wherein said heating means is a RF induction furnace.

13. The apparatus of claim 1, wherein said heating means is a resistive heater furnace.

14. The apparatus of claim 1, further comprising sealing means for sealing said growth chamber, said sealing means sufficient to maintain a material rate loss of less than 0.5 percent of an initial silicon carbide source weight per hour.

15. The apparatus of claim 14, said sealing means comprising graphite foam.

16. The apparatus of claim 1, further comprising crucible rotating means.

17. The apparatus of claim 1, wherein said first temperature gradient results in a temperature drop of between 5° C. and 25° C. between said single crystal silicon carbide seed crystal and said silicon carbide source.

18. The apparatus of claim 1, wherein said second temperature gradient between said silicon carbide source and crystalline growth front is in a range of 10° C. to 50° C. per centimeter.

19. The apparatus of claim 1, wherein said first heating means and said second heating means are the same.

20. The apparatus of claim 1, wherein said adjacent surface temperature is between 1° C. to 5° C. higher than said crystalline growth front temperature.

21. An apparatus for suppressing defects during growth of silicon carbide, the apparatus comprising:
a ring element, comprising:
a first annular portion sealably coupleable to a growth surface of a single crystal silicon carbide seed crystal, wherein an inner diameter of said first annular portion of said ring element is smaller than an outer diameter of said growth surface of said single crystal silicon carbide seed crystal;
a first conical inner surface, said first conical inner surface defining a laterally expanding portion of a crystalline growth front, wherein an angle between said first conical inner surface and a ring element axis is greater than 25 degrees, said first conical inner surface comprised of a material selected from the group of materials consisting of $Ta_xC_y$ and $Nb_xC_y$;
a second conical inner surface interposed between said first annular portion and said first conical inner surface, said second conical inner surface defining a laterally contracting portion of said crystalline growth front, said second conical inner surface comprised of a material selected from the group of materials consisting of $Ta_xC_y$ and $Nb_xC_y$;
a graphite heat sink coupleable to a non-growth surface of said single crystal silicon carbide seed crystal;
a growth chamber coupleable to said ring element and a silicon carbide source, said growth chamber comprised of a material selected from the group of materials consisting of $Ta_xC_y$ and $Nb_xC_y$;
a graphite crucible substantially enclosing said growth chamber;
a first heating means for applying at least a first temperature gradient and a second temperature gradient to said growth chamber, wherein said first temperature gradient promotes axial crystal growth and promotes lateral crystal expansion, and wherein said second temperature gradient promotes axial crystal growth and suppresses lateral crystal growth; and
a second heating means for maintaining a higher adjacent surface temperature than a crystalline growth front temperature.

22. An apparatus for suppressing defects during growth of silicon carbide, the apparatus comprising:
a ring element, comprising:
a first annular portion coupleable to a growth surface of a single crystal silicon carbide seed crystal;
a first conical inner surface, said first conical inner surface defining a laterally expanding portion of a crystalline growth front, wherein an angle between said first conical inner surface and a ring element axis is greater than 25 degrees;
a graphite heat sink coupleable to a non-growth surface of said single crystal silicon carbide seed crystal;
a growth chamber coupleable to said ring element and a silicon carbide source;
a graphite crucible substantially enclosing said growth chamber;
means for rotating said graphite crucible;
a first heating means for applying at least a first temperature gradient and a second temperature gradient to said growth chamber, wherein said first temperature gradient promotes axial crystal growth and promotes lateral crystal expansion, and wherein said second temperature gradient promotes axial crystal growth and suppresses lateral crystal growth; and
a second heating means for maintaining a higher adjacent surface temperature than a crystalline growth front temperature.

23. The apparatus of claim 22, further comprising a graphite foil interposed between said first annular portion of said ring element and said growth surface of said single crystal silicon carbide seed crystal, said graphite foil sealing said first annular portion of said ring element to said growth surface of said single crystal silicon carbide seed crystal.

24. The apparatus of claim 22, wherein an inner diameter of said first annular portion of said ring element is smaller than an outer diameter of said growth surface of said single crystal silicon carbide seed crystal.

25. The apparatus of claim 22, wherein said first conical inner surface is coated with a material selected from the group of materials consisting of $Ta_xC_y$ and $Nb_xC_y$.

26. The apparatus of claim 22, said ring element further comprising a second conical inner surface interposed between said first annular portion and said first conical inner surface, said second conical inner surface defining a laterally contracting portion of said crystalline growth front.

27. The apparatus of claim 26, wherein said second conical inner surface is coated with a material selected from the group of materials consisting of $Ta_xC_y$ and $Nb_xC_y$.

28. The apparatus of claim 22, wherein said angle between said first conical inner surface and said ring element axis is greater than 45 degrees.

29. The apparatus of claim 22, further comprising a graphite foil interposed between said graphite heat sink and said non-growth surface of said single crystal silicon carbide seed crystal, said graphite foil forming a continuous thermal contact between said graphite heat sink and said non-growth surface of said single crystal silicon carbide seed crystal.

30. The apparatus of claim 22, further comprising a graphite cylinder, wherein an outer portion of said ring element and an outer portion of said graphite heat sink are sealed to an inner surface of said graphite cylinder.

31. The apparatus of claim 22, wherein an inner surface of said growth chamber is comprised of a material selected from the group of materials consisting of $Ta_xC_y$ and $Nb_xC_y$.

32. The apparatus of claim 22, wherein said growth chamber separates said silicon carbide source and said growth surface of said single crystal silicon carbide seed crystal by a distance less than 30 percent of a silicon carbide source diameter.

33. The apparatus of claim 22, wherein said heating means is a RF induction furnace.

34. The apparatus of claim 22, wherein said heating means is a resistive heater furnace.

35. The apparatus of claim 22, further comprising sealing means for, sealing said growth chamber, said sealing means sufficient to maintain a material rate loss of less than 0.5 percent of an initial silicon carbide source weight per hour.

36. The apparatus of claim 35, said sealing means comprising graphite foam.

37. The apparatus of claim 22, wherein said first temperature gradient results in a temperature drop of between 5° C. and 25° C between said single crystal silicon carbide seed crystal and said silicon carbide source.

38. The apparatus of claim 22, wherein said second temperature gradient between said silicon carbide source and crystalline growth front is in a range of 10° C. to 50° C. per centimeter.

39. The apparatus of claim 22, wherein said first heating means and said second heating means are the same.

40. The apparatus of claim 22, wherein said adjacent surface temperature is between 1° C. to 5° C. higher than said crystalline growth front temperature.

* * * * *